(12) United States Patent
Quinnett et al.

(10) Patent No.: US 6,615,160 B1
(45) Date of Patent: Sep. 2, 2003

(54) METHODS AND APPARATUS FOR ENGINE DIAGNOSTICS

(75) Inventors: Wilbur V. Quinnett, Fond du Lac, WI (US); Scott A. Koerner, Kenosha, WI (US); Lester M. Szukala, Ingleside, IL (US); Phillip J. Bylsma, Brookfield, WI (US)

(73) Assignee: Bombardier Motor Corperation of America, Grant, FL (US)

( * ) Notice: Subject to any disclaimer, the term of this patent is extended or adjusted under 35 U.S.C. 154(b) by 0 days.

(21) Appl. No.: 09/430,228

(22) Filed: Oct. 29, 1999

Related U.S. Application Data
(60) Provisional application No. 60/134,326, filed on May 14, 1999, and provisional application No. 60/109,716, filed on Nov. 24, 1998.

(51) Int. Cl.[7] .............................................. G21G 17/00
(52) U.S. Cl. ..................... 702/185; 701/29; 701/35; 123/361; 123/363
(58) Field of Search .............................. 702/57, 60, 61, 702/62, 64, 65, 80, 119, 123, 124, 183, 185, FOR 103, FOR 104, FOR 106, FOR 134; 290/40; 324/399, 426; 701/1, 115; 123/406, 357, 361, 363

(56) References Cited

U.S. PATENT DOCUMENTS

| | | | | |
|---|---|---|---|---|
| 4,825,167 A | * | 4/1989 | Bayba | 324/399 |
| 5,091,858 A | * | 2/1992 | Paielli | 701/115 |
| 5,208,540 A | * | 5/1993 | Hoeflich | 324/388 |
| 5,394,327 A | * | 2/1995 | Simon, Jr. et al. | 701/1 |
| 5,491,631 A | * | 2/1996 | Shirane et al. | 701/35 |
| 5,594,646 A | * | 1/1997 | Itoh et al. | 701/35 |
| 5,610,574 A | * | 3/1997 | Mutoh et al. | 340/426 |
| 5,697,339 A | * | 12/1997 | Esposito | 123/357 |
| 5,937,825 A | * | 8/1999 | Motose | 123/406.13 |
| 6,052,631 A | * | 4/2000 | Busch et al. | 701/29 |
| 6,055,163 A | * | 4/2000 | Wagner et al. | 363/37 |
| 6,055,468 A | * | 4/2000 | Kaman et al. | 701/29 |
| 6,172,428 B1 | * | 1/2001 | Jordan | 290/40 C |
| 6,289,332 B2 | * | 9/2001 | Menig et al. | 707/1 |
| 6,377,879 B2 | * | 4/2002 | Kanno | 701/29 |

OTHER PUBLICATIONS

Outboard Marine Corp., OMC FFI Diagnostic Software v. 1.3 User's Guide, 1998.

* cited by examiner

*Primary Examiner*—Marc S. Hoff
*Assistant Examiner*—Mohamed Charioui
(74) *Attorney, Agent, or Firm*—Ziolkowski Patent Solutions Group, LLC

(57) ABSTRACT

Methods and apparatus for testing operation and diagnosing faults in an engine including an electronic control unit. A diagnostic computer is coupled to the electronic control unit and displays engine testing and diagnostic text messages in any one of a plurality of selectable languages, energize ignition circuits on demand, display menu screen displays associated with engine testing, diagnostics and service, and generate summary screen displays and reports for later use.

79 Claims, 11 Drawing Sheets

```
REMOVE ALL SPARK PLUG LEADS AND
CONNECT THEM TO A SPARK TESTER        62
SET AT AIR GAP SPECIFIED IN THE
       SERVICE MANUAL.

PRESS ANY KEY TO CONTINUE
```

FIG. 9

```
    ENTER IGNITION # TO FIRE

1) FIRE IGNITION # 1
       2) FIRE IGNITION # 2
       3) FIRE IGNITION # 3        64
       4) FIRE IGNITION # 4
       5) FIRE IGNITION # 5
       6) FIRE IGNITION # 6
       X) EXIT IGNITION TEST

SELECT 1 THRU 6 OR X
```

FIG. 10

ENGINE MONITORING

RUN TIME: 12:50:25　　　ECU ON TIME: 0:0:46

SENSORS — 68

| | VOLTS | °F | °C | %OPEN |
|---|---|---|---|---|
| AIR | 1.98 | 71 | 22 | — |
| WATER | 2.47 | 134 | 57 | — |
| ECU | 1.25 | 100 | 32 | — |
| TPS CAL. | — | — | — | 0 |
| TPS ACT. | 0.33 | — | — | — |

RESULTS — 74

| ENGINE SPEED | 600 | RPM |
|---|---|---|
| IGNITION TIMING | 1 | ms |
| SPARK DURATION | 5.00 | ms |
| FUEL TIMING | 11 | °BTDC |
| FUEL PULSE WIDTH | 5.33 | ms |
| BARO PRESSURE | 29.61 | In HG |

SWITCHES — 70

| IN S.L.O.W. | NO | SHIFT INTERRUPTER | NO |
|---|---|---|---|
| OVERHEAT | NO | WATER IN FUEL | NO |
| OIL PRESSURE | YES | | |

VOLTAGES — 72

| ALT. 12V | 14.9 |
|---|---|
| ALT. 26/40V | 15.7 |

| | |
|---|---|
| ENGINE MODEL NO. | E225FPXEEM |
| ENGINE SERIAL NO. | 2778 |
| HARD SERVICE CODES | 34, 41, 43 |
| INTERMITTENT CODES | 35, 37 |
| ECU SERIAL | 753 |
| SOFTWARE VERSION | 3030031 |
| SOFTWARE PCM | 22503 |
| ENGINE HOURS | 5 |
| BREAK-IN HOURS | 7443 |
| ECU ON TIME | 0:2 |
| AIR TEMP. | 107 C |
| ENGINE TEMP. | 159 C |
| ECU TEMP. | 23 C |
| TPS CALIBRATED | 664 |
| TPS ACTUAL | 0.04 |
| In S.L.O.W. | NO |
| OVERHEAT | NO |
| OIL PRESSURE | NO |
| SHIFT INTERRUPTER | NO |

| | |
|---|---|
| WATER IN FUEL | NO |
| ENGINE SPEED | 0 |
| IGNITION TIMING | 5 BTDC |
| SPARK DURATION | 0.6 ms |
| FUEL TIMING | 200BTDC |
| FUEL PULSE WIDTH | 10.33 ms |
| BARO PRESSURE | 31.98 HG |
| BATTERY | 14.88 |
| PDS VOLTAGE | 15.94 |
| 0-1000 RPM | 35% |
| 1000-2000 RPM | 24% |
| 2000-3000 RPM | 19% |
| 3000-4000 RPM | 6% |
| 4000-5000 RPM | 6% |
| 5000-6000 RPM | 10% |
| 6000- | 0% |
| INJECTOR #1 S/H | 98251000003102 |
| INJECTOR #2 S/H | 98251000110113 |
| INJECTOR #3 S/H | 98251000002102 |
| INJECTOR #4 S/H | 98251000109113 |
| INJECTOR #5 S/H | 98251000001102 |
| INJECTOR #6 S/H | 98251000111112 |

```
    BEFORE STARTING THIS PROCEDURE,
          MAKE SURE THAT

* THE DAMAGED ECU IS ON THE ENGINE
  * THE SERVICE REPLACEMENT ECU IS ON HAND
  * THE KEY SWITCH IS TURNED ON

PRESS ANY KEY TO COPY INFORMATION
   FROM THE DAMAGED ECU.  (ESC) TO CANCEL
```

INFORMATION COPIED SUCCESSFULLY!

* TURN KEY SWITCH OFF
* INSTALL SERVICE REPLACEMENT ECU
* TURN KEY SWITCH ON

PRESS ANY KEY TO COPY INFORMATION
TO NEW ECU. (ESC) TO CANCEL

FIG. 20

REPLACEMENT ECU HAS BEEN SUCCESSFULLY
INITIALIZED!

PRESS ANY KEY TO RETURN TO MENU

FIG. 21

METHODS AND APPARATUS FOR ENGINE DIAGNOSTICS

CROSS REFERENCE TO RELATED APPLICATIONS

This application claims the benefit of provisional patent application No. 60/134,326 filed May 14, 1999 and provisional patent application No. 60/109,716 filed Nov. 24, 1998.

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

This invention relates generally to engines and, more particularly, to performing engine diagnostics using a computer.

Many known internal combustion engines for use with watercraft include an electronic control unit (ECU) for controlling at least some operations of the engine. In a typical implementation, an ECU is electrically connected to engine components such as the engine ignition, lubrication pumps, water circulation system (if any) and fuel injectors. The ECU controls timing of the engine ignition and fuel injection in accordance with a pre-programmed control program.

In order to determine whether an engine is operating properly, and to assist in diagnosing an engine failure, an external computer can be coupled to a communications port of the ECU. A diagnostic program implemented in computer software, such as the BMCA FFI engine diagnostic software available from Bombardier Motor Corporation of America, Waukegan, Ill., is loaded in the external computer. Fault codes stored in the ECU memory are read by the external computer, and the fault codes are indicative of certain messages that are then displayed to the operator. In addition, an operator may input commands via a keyboard of the computer and/or touch screen, and based on the operator inputs, the external computer instructs the ECU to run diagnostic tests on the engine.

Outboard engines are sold in many different countries, and the diagnostic software interface should be capable of displaying text messages in at least one of many different languages. Generating many different software versions that display text messages in different respective languages can be costly. For example, tracking and delivering diagnostic software to many different customers worldwide in accordance with the language needs of each specific customer is burdensome and error prone.

In addition to fault codes, other information such as engine speed, battery voltage and alternator voltage can be displayed on various separate screens. Use of these separate screens, however, can be cumbersome.

Current diagnostic software requires the throttle to be reduced to idle in order to run the diagnostic software package. Current diagnostic software also does not provide a service report which can be printed immediately or saved in a computer. This leaves both the customer and repairmen with less than full information.

Replacement of the ECU is complicated due to the need to customize the ECU to the particular engine. The need to customize the ECU makes it a time consuming repair operation and thus increases the cost to the customer of repairs involving replacement of the ECU.

If the diagnostic software is used on engines having fuel injectors, there has previously been no way to verify that the ECU is customized to the proper fuel injectors except for running operational tests and determining if the fuel injectors are working properly.

BRIEF SUMMARY OF THE INVENTION

The present invention, in one aspect, is a method for operating a computer to display text messages in any one of a plurality of selectable languages. Text files for each selectable language are stored in the non-volatile memory of the computer, and based on an operator selection, text files corresponding to the selected language are copied from non-volatile memory to the computer random access memory (RAM). The text files in RAM are utilized by the computer processor to generate screen displays.

More specifically, a typical computer includes a processor, a random access memory (RAM), and a non-volatile memory such as a read only memory (ROM). The RAM and the ROM are coupled to the processor. Text files corresponding to various selectable languages are stored in ROM, and a default language is copied from ROM into RAM. The processor, after start-up of the computer and initialization of the program, generates screen displays using the text file stored in RAM.

If an operator desires to have the screen displays in one of the other selectable languages, then upon receipt of the appropriate command, the text file or files corresponding to the desired language are copied from ROM into RAM, and the processor then uses newly copied text files in RAM to generate the screen displays. As a result, the screen displays are in the user selected language.

In addition to the language improvements, the diagnostic software, in one embodiment, improves the display of air temperature, water temperature, ECU temperature, ignition duration and TPS actual values when connected to a water cooled ECU.

In one embodiment, the diagnostic software allows starting of software with the engine at running speed, provides a full-service report, permits copying of engine-specific information from an original ECU into a service replacement ECU, and enables fuel injector serial numbers to be identified.

BRIEF DESCRIPTION OF THE DRAWINGS

FIGS. 6–10 illustrate screen displays associated with performing an ignition coil test.

FIG. 11 illustrates an engine operation screen display.

FIGS. 14 and 15 illustrate ECU printouts.

FIGS. 18–21 illustrate ECU service screen displays.

DETAILED DESCRIPTION OF THE INVENTION

Although the present invention is sometimes described herein in the context of performing diagnostic tests on an outboard engine, the present invention can be utilized in connection with diagnostic tests for many different types of engines, including automobile engines. For example, and although the present invention is described herein in connection with an engine that includes fuel injection, the invention can be utilized in connection with engines that include any one of a wide variety of fuel injection mechanisms, electrically powered engines and in engines that include other fuel or energy supply systems. In addition, the methods and apparatus for enabling operator selection of a language as described herein can be utilized in many different applications in addition to diagnostic testing. The present invention is not limited to use in connection with only outboard engine diagnostic test operations.

Figure 1:
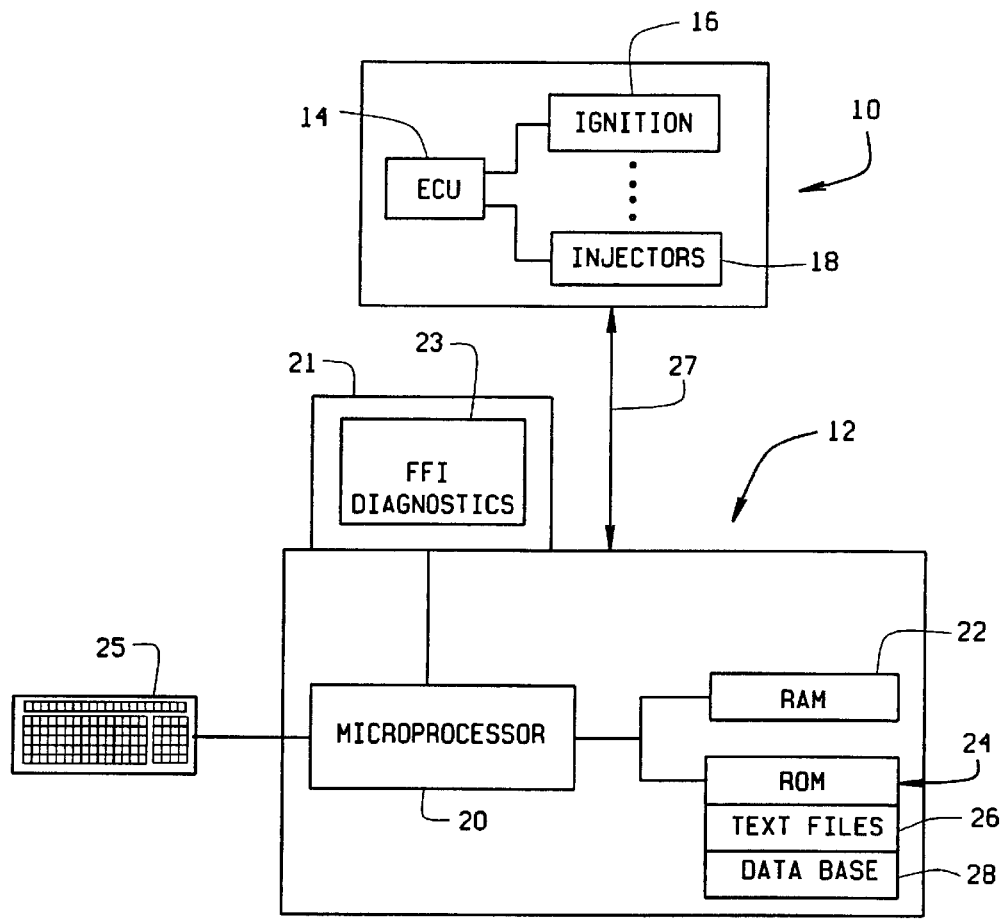
FIG. 1 is a block diagram of an engine and an external computer coupled to the engine.

FIG. 1 is a block diagram of an engine 10 and an external computer 12 coupled to engine 10. Engine 10 is, in one embodiment, an internal combustion engine including fuel injection, such as an Evinrude outboard engine commercially available from Bombardier Motor Corporation of America, Waukegan, Ill. As explained above, engine 10 may be an automobile engine, or any other type of engine which can benefit from the use of diagnostic software.

Engine 10 includes an electronic control unit (ECU) 14 coupled to engine components such as engine ignition 16 and fuel injectors 18, which can be conventional or non-conventional. Generally, ECU 14 controls operation of engine 10 and provides information to the operator by controlling various indicator lights in gauges. ECU 14 controls operation of engine 10 by, for example, controlling firing of spark plugs via ignition 16 and controlling supply of fuel to the engine cylinders via injectors 18.

Computer 12 is a diagnostic computer that is coupled by a command/data link 25 to ECU 14 for use by a diagnostic operator or repairman for servicing engine 10. Computer 12 includes a microprocessor 20 coupled to a random access memory (RAM) 22 and a read only memory (ROM) 24. Computer 12 also has a monitor 21 with a display screen 23. In one embodiment, computer 12 is a battery-powered laptop computer, and processor 20 is a 286 MHz MSDOS processor. Of course, other operating systems such as MacOS, Linux or Windows NT could be used. Likewise, higher speed processors such as 386 MHz, 486 MHz, Pentium, PentiumII, Cyrix, AMD, Celeron or other more modern processor may be used. Also, ROM 24 includes, in one embodiment, at least 400 kilobytes of available memory. However, the required amount of memory depends upon the program in which the present invention is associated. Computer 12 also includes, for example, a monochromatic or color display 23 and a keyboard 25 for entry of user commands and data Many other types and models of computers can be used, and the present invention is not limited to practice in connection with any one particular type of computer.

Commands, programs and data are transmitted from microprocessor 20 to ECU 14 via link 25. Commands, programs and data are transmitted from ECU 14 to processor 20 via link 25. For some operations, only commands will be sent and for other operations only data will be sent. Programs may be sent only on start-up or may be sent periodically as various functions all are selected and activated.

As described hereinafter in more detail, ROM 24 includes text files 26 and database files 28. Files 26 and 28 are loaded into ROM from a CD, a high-capacity disk such as a "ZIP disk", "JAZZ disk" or "Super Disk", or just a standard floppy disk, e.g., a 1.44 Meg 3½ inch floppy disk, depending primarily upon the size and complexity of the files 26 and 28. Text files 26 contain the text for various screen displays to be shown on the display of computer 12. Although the term "text files" is used, it will be understood that this term means any file containing data which can be read by computer 12 to cause the display of textual material, or screen displays, on display screen 23. Database files 28 contain the fault codes and other information to be utilized in connection with diagnostic operations.

By having text files 26 external separate from the program, no display text internal to the program is required, and there is no need to recompile the program just for a language change. That is, if an operator wants the screens displayed in a different language from the current language (e.g., the operator wants the screen displays in French rather than English), the operator simply follows the steps described below and the program then utilizes the text files corresponding to the selected language to generate screen displays.

Prior to operation, the diagnostic software program is loaded into computer 12 from, for example, a floppy disk. An install program is run to cause the diagnostic program, including text files and data bases, to be loaded into ROM 24. In one specific exemplary embodiment, sixteen text files are used for storing text associated with eight different languages such as, for example, English, Francais (French), Espanol (Spanish), Portuguese, Deutsch (German), Italiano (Italian), Swedish, and Finnish. Any multiple number of languages could be used.

Figure 2:
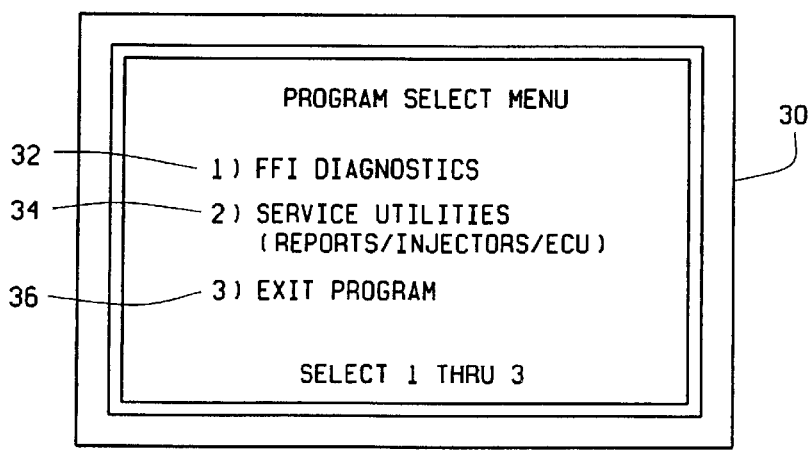
FIG. 2 illustrates an initial screen display for permitting an operator to select between a diagnostic program and a service utilities program.

Upon initialization of the diagnostic program now stored in computer 12, microprocessor 20 uploads from ROM 24 and into RAM 22 text files 26 having the screen display information in English, and causes a screen display 30 (shown in FIG. 2) to be shown on the display screen 23. Although the default language in the embodiment described herein is English, the default language could be any one of the languages for which text files exist. Screen display 30 provides three options 1) (FFI DIAGONOSTICS), 2) (SERVICE UTILITIES) OR X (EXIT PROGRAM).

Figure 3:
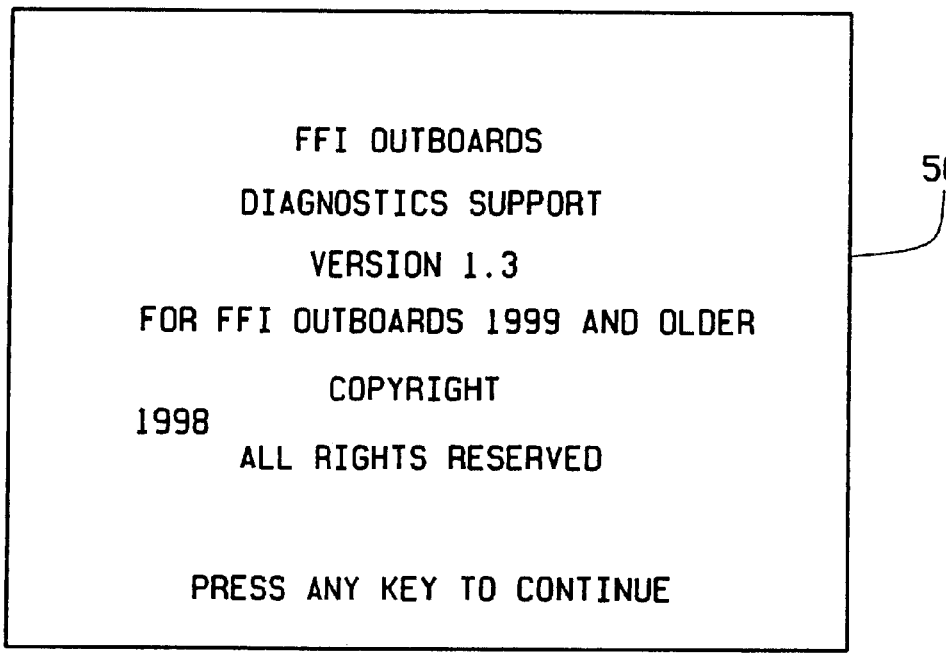
FIGS. 3–5 illustrate screen displays for enabling an operator to select operation of an engine diagnostic program in a desired language.
Figure 4:
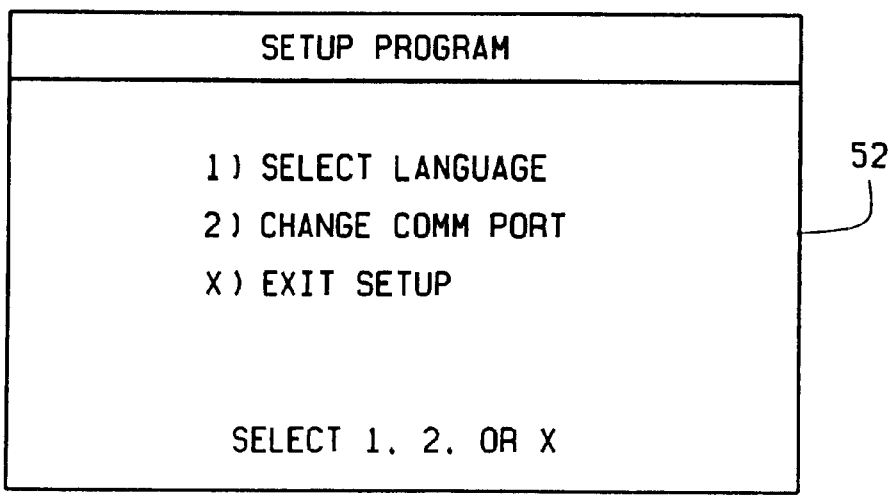
Figure 5:
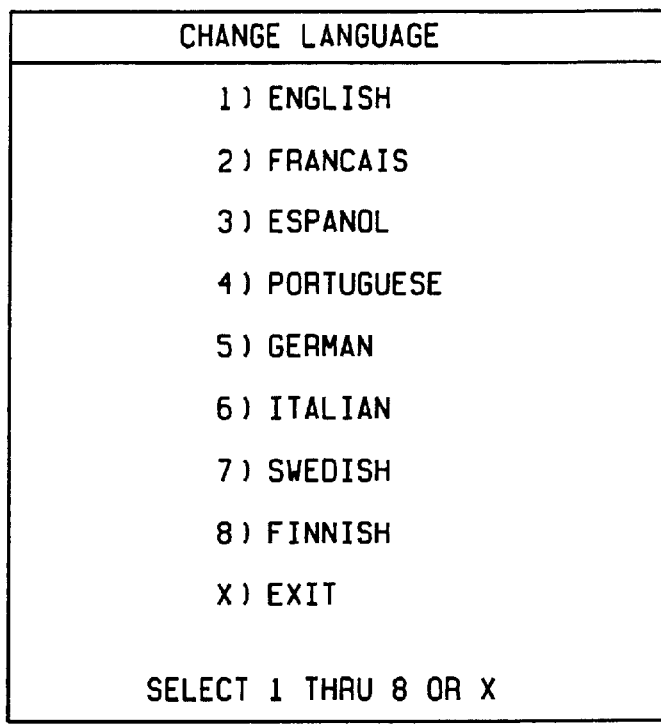

Upon receiving an input indicating that an operator has pressed a 1 key on keyboard 25 in response to the display 30, processor 20 causes a screen display 50 as shown in FIG. 3 to be shown on the computer display. If the operator desires at this stage to configure the computer for a non-English language, the operator may enter a setup program by pushing the F3 key on keyboard 25. Upon receiving an input indicating that an operator has pressed the F3 key on keyboard 25, processor 20 then causes a screen display 52 as shown in FIG. 4 to be shown on the computer display. An operator can then select 1 (SELECT LANGUAGE), 2 (CHANGE COMM PORT), or x (EXIT SETUP) on keyboard 25. If the operator selects a 1, then processor 20 causes a language selection screen display 54 as shown in FIG. 5 to be shown on display screen 23.

When screen display 54 is being displayed on-screen 23, an operator can then select 1 (ENGLISH), 2 (FRANCAIS), 3 (ESPANOL), 4 (PORTUGUESE), 5 (GERMAN), 6 (ITALIAN), 7 (SWEDISH), 8 (FINNISH) or x (EXIT) on keyboard 25. For example, if the operator selects 2, i.e., French, then microprocessor 20 uploads from ROM 24 the text file(s) corresponding to French text into RAM 22. That is, the text files from the selected language are copied over the text files currently stored in RAM 22. Processor 20 when generating screen displays then subsequently uses the most recently uploaded text files and returns the operator to screen display 50 (shown in FIG. 3). Upon pressing any key on keyboard 25 while screen 50 is displaying, computer 12 displays the main menu screen display 56 (shown in FIG. 6).

Generally, and in some diagnostic testing operations, microprocessor 20, in response to operator commands, instructs ECU 14 to energize certain selected components to verify operation, e.g., to verify operation of ignition 16 and fuel injectors 18. In verifying operation of ignition 16, for example, a command from processor 20 causes ECU 14 to fire a respective ignition circuit, and the operator can observe whether the circuit does, in fact, fire. In one embodiment the portion of the ignition preceding the ignition coil is all in ECU 14, so that ECU 14 may electrically determine if the ignition coil, is working properly. This allows the ECU to determine whether it is spark plugs or ignition coil that is causing any observed failure to fire. In other diagnostic testing operations, microprocessor 20 instructs ECU 14 to display various operating conditions of engine 10.

Figure 6:
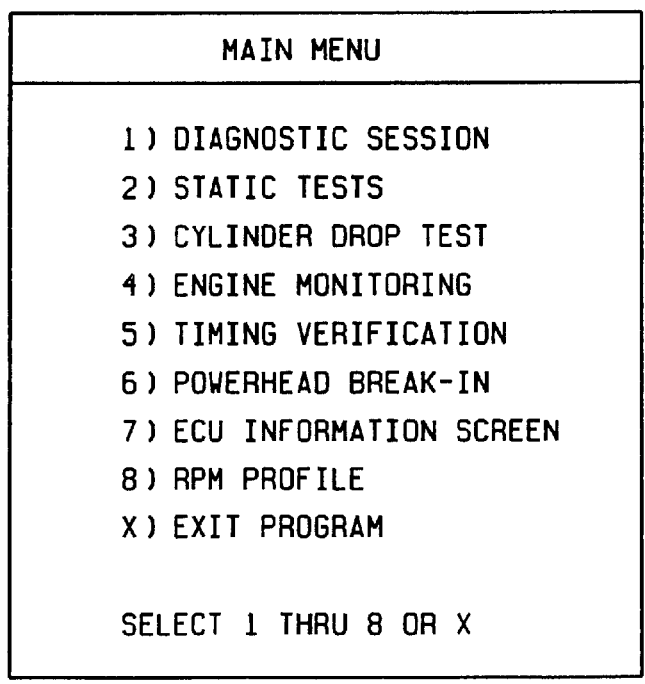

FIGS. 6–10 illustrate screen displays associated with performing an ignition coil test. After performing the program set-up operations as described above, processor 20 causes main menu screen display 56 as shown in FIG. 6 to be displayed on the computer display. If, for example, the operator desires to perform a static test, the operator presses the 2 key on keyboard 25. Upon receipt of data indicating the user selection, processor 20 executes the routine associated with the selected test.

Figure 7:
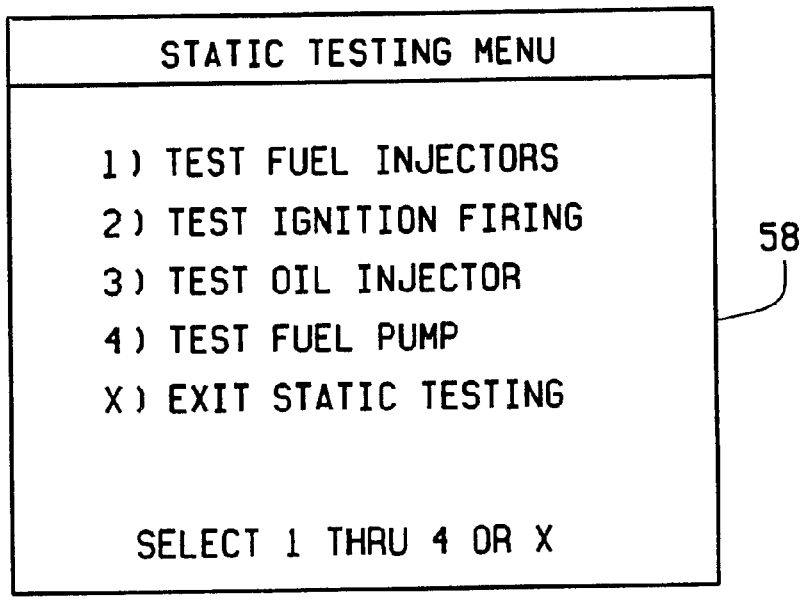

Particularly, upon receiving an input corresponding to the user selection of 2, processor 20 causes a static testing menu screen display 58 as shown in FIG. 7 to be displayed. The operator can then select one of four tests by selecting 1–4, or can exit by selecting x. If the operator desires to test ignition firing, the operator selects 2. It will be understood that any number of static tests could be performed, and that the four tests shown in FIG. 7 are only exemplary.

Figure 8:
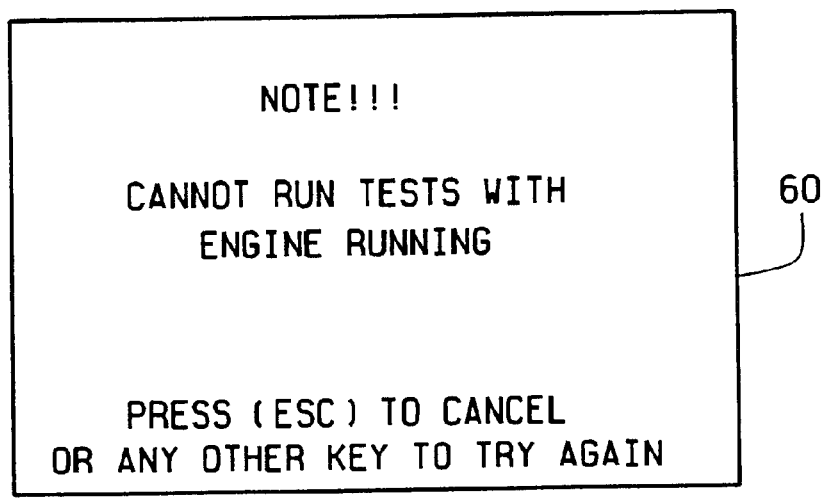

Upon receipt of the user selection of 2, processor 20 causes a warning screen display 60 as shown in FIG. 8 to be displayed. The operator can then continue by either canceling the test by selecting <ESC>, or proceeding with the test by selecting any other key of keyboard 25.

If processor 20 receives an input indicating that the operator desires to continue with testing, then processor 20 causes a message screen display 62 as shown in FIG. 9 to be displayed. The message instructs the operator to remove all spark plug leads and to connect the leads to a spark tester and to set the air gap. Once the operator has carried out the instructions, the operator continues by pressing any key of keyboard 25.

Upon receipt of an input indicating that the operator has performed the instructed tasks, processor 20 then causes an ignition selection screen display 64 as shown in FIG. 10 to be displayed. The operator can then cause any of the ignition circuits to fire by selecting 1–6, or can exit by selecting x. The numbers 1–6 correspond to respective cylinders of a six cylinder engine. For example, if the operator selects 2, processor 20 communicates to ECU 14 that the ignition circuit, or coil, corresponding to cylinder #2 should fire. The operator can then observe whether a spark is generated by such ignition circuit by observing the spark tester after making the selection.

In addition to static tests, tests of the engine under operating conditions can be performed. In prior versions of diagnostic software for such applications, it was necessary to reduce the engine speed to idle before running the diagnostic software test for the engine under operating conditions. Accordingly, in those versions a screen warning was presented warning the operator to reduce the speed to title before proceeding with the remaining diagnostic tests. However, the software has now been upgraded to allow the running of the diagnostic tests at full speed, so that warnings no longer appear.

The diagnostic software in one embodiment also provides a screen display 66 (shown in FIG. 11) of the operation the engine 10 divided into a sensor section 68, a switches section 70, a voltage section 72 and the results section 74. Sensor section 68 displays air temperature, water temperature, ECU temperature, ignition duration, and TPS (throttle position sensor) actual and calculated values when connected to a water cooled ECU. With a water-cooled ECU, such indications are very important to determine whether or not the ECU is being properly cooled by the water coolant system. ECU malfunctions caused by coolant system malfunctions can now be identified and corrected without destroying a replacement ECU in order to determine that the ECU is not the problem. In one embodiment section 68 displays not only the temperature in degrees Fahrenheit, but also the temperature in degrees Centigrade and the voltage output of the temperature sensor involved. This allows the diagnostic operator to determine if the sensor is working properly by checking to see if proper voltage signals are being provided by the sensors. This section 68 also allows the diagnostic operator to determine if the temperature of air, water and ECU are high or low. Section 70 provides indication of various switch conditions such as overheat, oil pressure within limits, shift interrupt or activated, water found in fuel, and whether or not the engine is in S.L.O.W. Section 72 provides the current voltage is for the alternator, both in the 12 volt and the 26/46 volt portions. Section 74 includes engine speed, ignition timing, spark duration, fuel injection timing, fuel pulse width and barometric pressure. The presence of all these conditions in a single screen display is of particular value to the diagnostic operator or service repairman.

Figure 12:
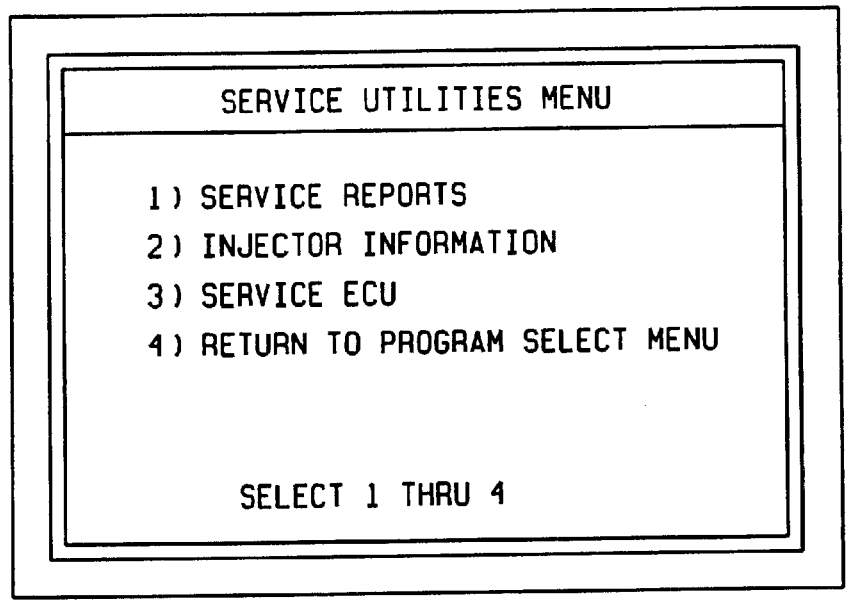
FIGS. 12 and 13 are engine service utility screen displays.

If, instead of selecting key 1 in response to screen display 30 (shown in FIG. 2), the operator selects key 2 to select service utilities programs, screen 74 (shown in FIG. 12) appears. This screen display 74 is the service utilities menu and allows the operator to select from four subprograms 1) SERVICE REPORTS, 2) INJECTOR INFORMATION, 3) SERVICE ECU, and 4) RETURN TO PROGRAM SELECTION MENU.

Figure 13:
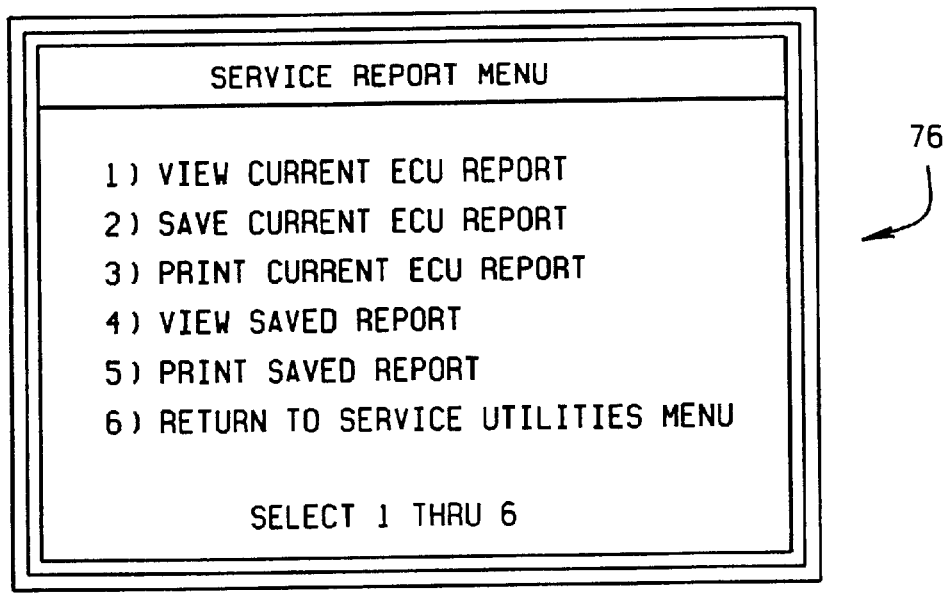

If the operator presses key 1 of keyboard 25 to call up the service reports sub program, the service report menu screen display 76 (shown in FIG. 13) will be displayed. This menu gives the operator six choices 1) VIEW CURRENT ECU REPORT, 2) SAVE CURRENT ECU REPORT, 3) PRINT CURRENT ECU REPORT, 4) VIEW SAVED REPORT, 5) PRINT SAVED REPORT, 6) RETURN TO SERVICE UTILITIES MENU. If the operator then presses key 1 of keyboard 25, a very complete two-page ECU printout, as shown in FIG. 14 and FIG. 15, is provided.

Figure 16:
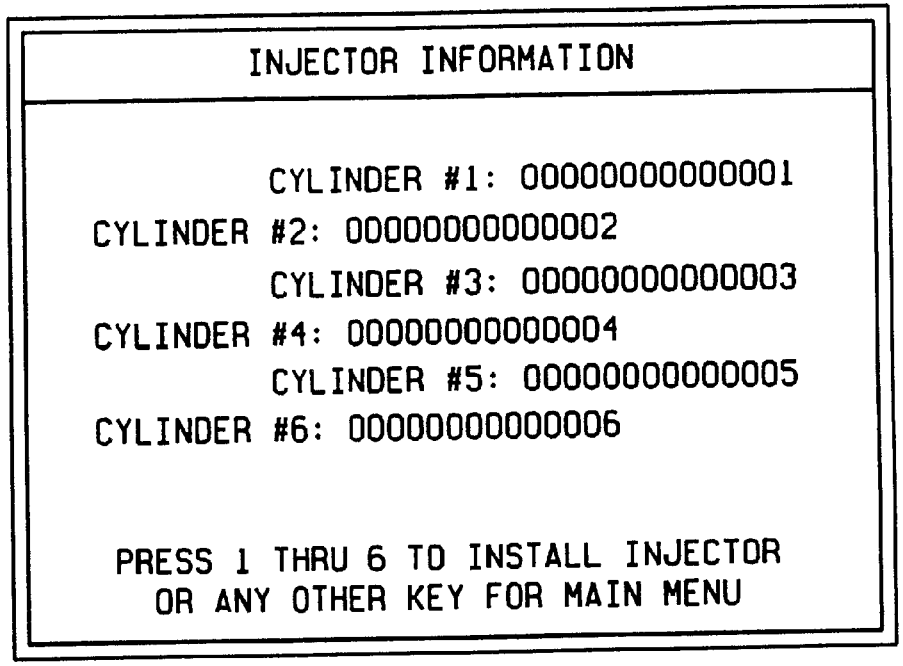
FIGS. 16 and 17 illustrate injector information screen displays.
Figure 17:
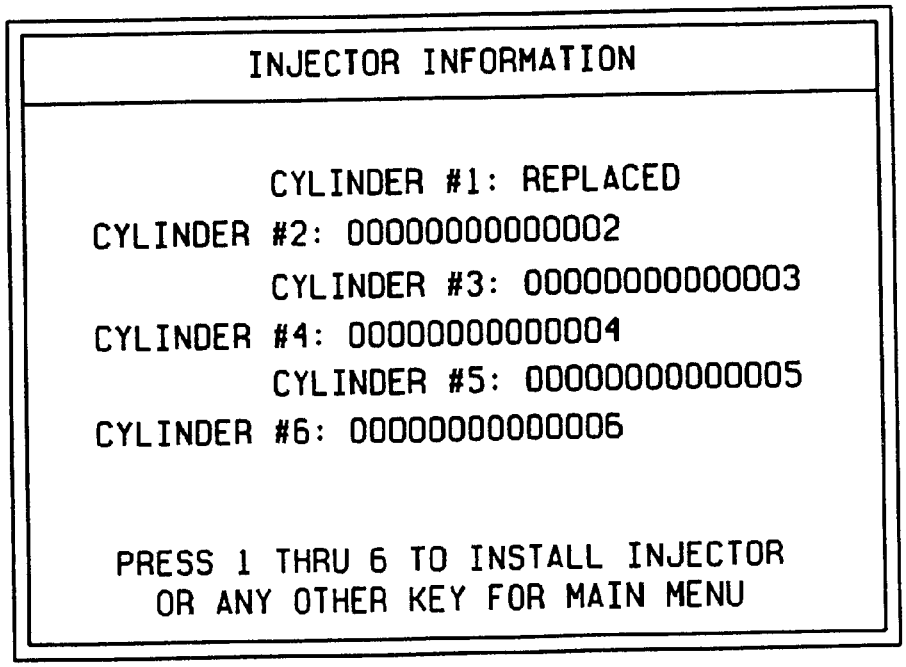

If the operator presses key 2 of keyboard 25 in response to screen 74 (shown in FIG. 12), injectors information screen display 82 (shown in FIG. 16) is displayed on screen 23. Screen display 82 provides the serial number of each injector for each cylinder of engine 10. This allows the operator to verify that the proper type of injector is installed in engine 10. If an incorrect injector, for example injector 1, is detected, a replacement can be installed and the screen 82 will automatically indicate by a second screen display 84 (shown in FIG. 17) that such injector 1 has been replaced.

Figures 18, 19:
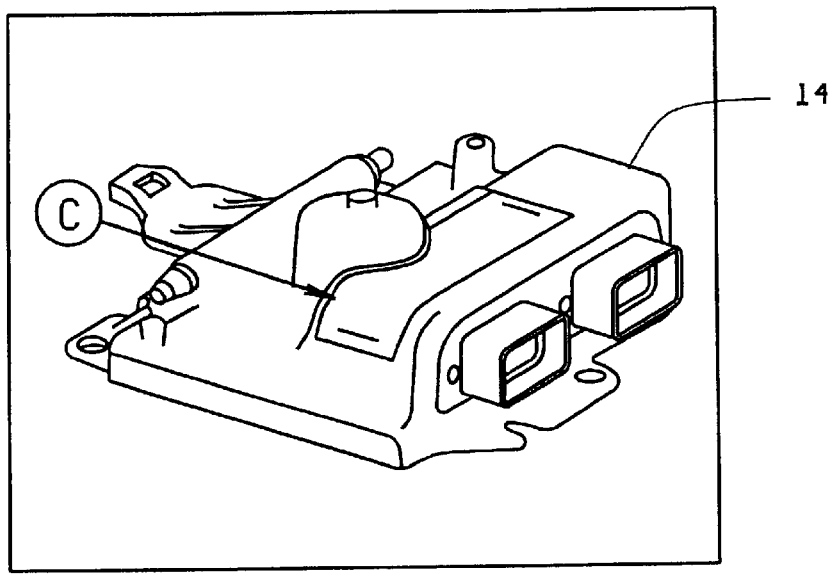

If the operator determines that replacement of the ECU 14 is required, the operator obtains screen display 74 (shown in FIG. 12) as described above, and presses key 3 on keyboard 25 to call screen display 86 (shown in FIG. 19) on display screen 23. Screen display 86 is a warning screen that advises the operator of the operations that must be performed before the ECU can be replaced using the diagnostic software properly. The operator now confirms that the required operations have been performed and ECU 14 is ready to be replaced. Upon such confirmation, the operator presses any key of keyboard 25 to cause microprocessor 20 to transfer all of the specific ECU information from the replaced ECU into microprocessor 20 and, upon completion of such information transfer, to call up screen display 88 (shown in FIG. 20) indicating successful transfer. Screen display 88 further instructs the operator to now turn the ignition key off, replace the existing ECU with the replacement ECU, and turn the ignition key back on and then press any key the keyboard 25. Upon sensing that a key has been pressed on keyboard 25, microprocessor 20 now transfers the stored information from microprocessor 20 relative to the existing ECU into the replacement ECU and calls up screen display 90 (shown in FIG. 21) to indicate the successful completion of the information transfer from the existing ECU into the new replacement ECU.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

What is claimed is:

1. A diagnostic method for an engine including an ECU, the method utilizing a diagnostic computer including a display screen, said method comprising the steps of:
    coupling the computer to the engine ECU;
    operating said computer through a plurality of a screen displays relating to engine diagnostics and testing, said screen displays generated on the display screen, at least one of said display screens requiring selection between
        (a) provision of service reports and
        (b) provision of an item of engine component information, or
        (c) return to a display
    displaying, in response to selection of provision of service reports, one or more displays on the monitor allowing printing of a service report including a printed record of a plurality of switch positions of the engine.

2. A method in accordance with claim 1 further comprising displaying a service utilities menu screen display, said service utilities menu display facilitating assistance with replacement of a current ECU.

3. A method in accordance with claim 2 wherein such assistance includes extracting at least one engine specific piece of information from a memory of the current ECU, storing such extracted piece of information in memory associated with said computer and subsequently transferring such stored piece of information to a memory of a replacement ECU.

4. A method in accordance with claim 2 wherein such assistance includes extracting multiple engine specific pieces of information from a memory of the current ECU, storing all extracted pieces of information in memory associated with said computer and subsequently transferring all stored pieces of information to a memory of a replacement ECU.

5. A method in accordance with claim 2 wherein such assistance includes extracting all engine specific pieces of information from a memory of the current ECU, storing all extracted pieces of information in memory associated with said computer and subsequently transferring all stored pieces of information to a memory of a replacement ECU.

6. The method of claim 1 further comprising the step of providing, responsive to selection of engine component information, assistance with replacement of a current ECU with a replacement ECU.

7. Apparatus in accordance with claim 6 wherein said assistance includes extracting multiple engine specific pieces of information from a memory of the current ECU, storing such extracted pieces of information in a memory associated with said computer and subsequently transferring such stored pieces of information to a memory of a replacement ECU.

8. Apparatus in accordance with claim 6 wherein said engine assistance includes extracting all engine specific information from a memory of the current ECU, storing all such extracted engine specific information in a memory associated with said computer and subsequently transferring all such stored engine specific information to a memory of a replacement ECU.

9. A method in accordance with claim 1 further comprising conducting a diagnostic test and providing a screen display showing a plurality of service fault codes and including all of said plurality of service fault codes in said service report.

10. A method in accordance with claim 9 wherein said item of engine component information includes fuel injector serial numbers and said processor is programmed to cause a screen display of said injector serial numbers on said monitor in response to selection of provision of an item of engine component information.

11. A method in accordance with claim 10 wherein said processor is programmed to cause a screen display of said injector serial numbers on said display screen in response to selection of provision of engine information.

12. A method in accordance with claim,wherein said engine is a marine engine.

13. A method in accordance with claim 12 wherein said engine is an outboard engine.

14. A method in accordance with claim 1 further comprising the step of:
    causing, responsive to selection of provision of service reports in response to said screen display requiring selection, a second screen display allowing selection between one or more saved service reports and a current service report.

15. Apparatus A method in accordance with claim 1 wherein operating said computer causes a screen display allowing selection between printing a saved service report, viewing a saved service report, viewing a current service report, printing a current service report and saving a current service report.

16. A method in accordance with claim 1 further comprising displaying one or more screen displays on the display screen allowing printing of a service report including a print of a name of an owner of the engine.

17. A method in accordance with claim 1 further comprising displaying, in response to selection of provision of service reports, one or more screen displays on the display screen allowing printing of a service report including a print of a model number of the engine.

18. A method in accordance with claim 1 further comprising displaying, in response to selection of provision of service reports, one or more displays on the display screen allowing printing of a service report including a print of a serial number of the engine.

19. A method in accordance with claim 1 further comprising displaying, in response to selection of provision of service reports, one or more screen displays on the display screen allowing printing of a service report including a print of an ECU program number of the engine.

20. A method in accordance with claim 1 further comprising displaying, in response to selection of provision of service reports, one or more screen displays on the display screen allowing printing of a service report including a print of ECU version number of the engine.

21. A method in accordance with claim 1 wherein said method further comprises conducting a diagnostic test producing a screen display showing a plurality of switch positions, and said service report includes at least one switch position from said display screen.

22. A method in accordance with claim 1 wherein said method further comprises conducting a diagnostic test producing a screen display showing switch positions, said service report including all said switch positions.

23. A method in accordance with claim 1 wherein said method further comprises conducting a diagnostic test producing a screen display showing a plurality of sensor positions, said service report including a plurality of sensor positions from said screen display.

24. A method in accordance with claim 1 wherein said method further comprises conducting a diagnostic test producing a screen display showing sensor positions, and said service report includes at least one sensor position from said screen display.

25. A method in accordance with claim 1 wherein said method further comprises conducting a diagnostic test producing a screen display showing sensor positions, said service report including all sensor positions from said display screen.

26. A method in accordance with claim 1 wherein said method further comprises conducting a diagnostic test producing a screen display showing an engine speed profile and said service report includes said engine speed profile.

27. A method in accordance with claim 1 wherein said method further comprises conducting a diagnostic test producing a screen display showing an engine speed and said service report includes a profile which includes said engine speed.

28. A method in accordance with claim 1 wherein said method further comprises conducting a diagnostic test involving various engine speeds producing a screen display showing an engine speed and said service report includes an engine speed profile showing various engine speed ranges in RPM and the percentage of time during the test that the engine speed was in each engine speed range.

29. A method in accordance with claim 1 wherein said method further comprises conducting a diagnostic test producing a screen display showing a service fault code and said service report includes said service fault code.

30. A method in accordance with claim 1, wherein said method further comprises conducting a diagnostic test producing a screen display showing a plurality of service fault codes and said service report includes said all of said plurality of service fault codes.

31. A method in accordance with claim 1 further comprising saving the service report to a memory unit operatively connected to said processor.

32. The method of claim 1 further comprising the step of causing, responsive to selection of provision of engine component information a second screen display that facilitates an injector serial number screen display.

33. Apparatus for diagnostic operation of an engine including an ECU, said apparatus comprising:
a processor configured to be coupled to the engine ECU;
a display screen coupled to said processor;
said processor is programmed to cause a screen display on said display screen to require selection between:
(a) provision of engine specific service reports,
(b) provision of a specific item of engine component information, and
(c) return to a prior display
said processor is also programmed to conduct a diagnostic test and provide a screen display showing an engine profile and said service report includes said engine profile.

34. Apparatus in accordance with claim 33 wherein said processor is programmed to cause, in response to selection of provision of engine specific service reports, one or more displays allowing printing of a service report that includes a printed record of a plurality of switch positions of the engine.

35. Apparatus in accordance with claim 34 wherein said processor is also programmed to conduct a diagnostic test and provide a screen display showing switch positions, and said plurality of switch positions in said service report includes at least one switch position from said screen display.

36. Apparatus in accordance with claim 34 wherein said processor is also programmed to conduct a diagnostic test and provide a screen display showing switch positions, and said plurality of switch positions in said service report includes all switch positions from said screen display.

37. Apparatus in accordance with claim 33 wherein said processor is programmed to cause, in response to selection of provision of engine specific service reports, one or more displays allowing printing of a service report that includes a printed record of a plurality of sensor values.

38. Apparatus in accordance with claim 37 wherein said processor is also programmed to conduct a diagnostic test and provide a screen display showing sensor positions, and said plurality of sensor positions in said service report includes at least one sensor position from said screen display.

39. Apparatus in accordance with claim 37 wherein said processor is also programmed to conduct a diagnostic test and provide a screen display showing sensor positions, and said plurality of sensor positions in said service report includes all sensor positions from said screen display.

40. Apparatus in accordance with claim 33 wherein said specific item of engine component information includes assistance with replacement of a current ECU with a replacement ECU and said processor is programmed to extract at least one engine specific piece of information from a memory of the current ECU, to store such extracted piece of information in memory associated with said processor and to subsequently transfer such stored piece of information to a memory of a replacement ECU.

41. Apparatus in accordance with claim 40 wherein said processor is programmed to extract multiple engine specific pieces of information from a memory of the current ECU, to store such extracted pieces of information in memory associated with said processor and to subsequently transfer such stored pieces of information to a memory of a replacement ECU.

42. Apparatus in accordance with claim 40 wherein said processor is programmed to extract all engine specific information from a memory of the current ECU, to store all such extracted engine specific information in memory associated with said processor and to subsequently transfer all such stored engine specific information to a memory of a replacement ECU.

43. Apparatus in accordance with claim 33 wherein said processor is also programmed to conduct a diagnostic test and provide a screen display showing a service fault code and said service report includes said service fault code.

44. Apparatus in accordance with claim 43 wherein said processor is also programmed to conduct a diagnostic test and provide a screen display showing a plurality of service fault codes and said service report includes all of said plurality of service fault codes.

45. Apparatus in accordance with claim 33 wherein said engine is a marine engine.

46. Apparatus in accordance with claim 45 wherein said engine is an outboard engine.

47. Apparatus in accordance with claim 33 wherein said specific item of engine component information includes fuel injector serial numbers and said processor is programmed to cause a screen display of said injector serial numbers.

48. Apparatus in accordance with claim 47 wherein said processor is programmed to cause storage of nominal service replacement injector settings in said ECU in response to operator entry of data indicative of replacement of an injector.

49. Apparatus in accordance with claim 33 wherein said processor is further programmed to cause, in response to a selection of provision of engine specific service reports, a screen display allowing selection between a saved service report and a current service report.

50. Apparatus in accordance with claim 33 wherein said processor is further programmed to cause, in response to a selection of provision of engine specific service reports, a screen display allowing selection between printing a saved service report, viewing a saved service report, viewing a current service report, printing a current service report and saving a current service report.

51. Apparatus in accordance with claim 33 wherein said processor is programmed to cause, in response to selection of provision of engine specific service reports, one or more screen displays allowing printing of a service report that includes a print of a name of an owner of the engine.

52. Apparatus in accordance with claim 33 wherein said processor is programmed to cause, in response to selection of provision of engine specific service reports, one or more displays allowing printing of a service report that includes a print of a model number of the engine.

53. Apparatus in accordance with claim 33 wherein said processor is programmed to cause, in response to selection of provision of engine specific service reports, one or more displays allowing printing of a service report that includes a print of a serial number of the engine.

54. Apparatus in accordance with claim 33 wherein said processor is programmed to cause, in response to selection of provision of engine specific service reports, one or more displays allowing printing of a service report that includes a print of an ECU program number of the engine.

55. Apparatus in accordance with claim 33 wherein said processor is programmed to cause, in response to selection of provision of engine specific service reports, one or more displays allowing printing of a service report that includes a print of ECU version number of the engine.

56. Apparatus in accordance with claim 33 wherein said processor is also programmed to conduct a diagnostic test and provide a screen display showing an engine speed, and said service report includes a profile which includes said engine speed.

57. Apparatus in accordance with claim 33 wherein said processor is also programmed to conduct a diagnostic test and provide a display screen showing an engine speed and said service report includes said engine speed profile showing various engine speed ranges in RPM and the percentage of time during the test that the engine speed was in each engine speed range.

58. Apparatus in accordance with claim 33 wherein said processor is also programmed to allow saving the service report to a memory unit operatively connected to said processor.

59. Apparatus in accordance with claim 33 wherein said processor is also programmed to generate said screen display in one of a plurality of selected languages.

60. Apparatus for testing operation of and diagnosing a fault in an outboard engine including an ECU, said apparatus comprising:

a processor configured to be coupled to the outboard engine electronic control unit;

a screen display coupled to said processor;

said processor adapted to cause display of at least a single screen display divided into and having a sensor section, a switch section, a voltage section and an engine results section.

61. Apparatus in accordance with claim 60 wherein the sensor section comprises an electronic control unit temperature display.

62. Apparatus in accordance with claim 60 wherein the sensor section comprises an air temperature display.

63. Apparatus in accordance with claim 60 wherein the sensor section comprises a water temperature display.

64. Apparatus in accordance with claim 60 wherein the sensor section comprises a calculated throttle position sensor display.

65. Apparatus in accordance with claim 60 wherein the sensor section comprises an actual throttle position sensor display.

66. Apparatus in accordance with claim 60 wherein the switch section includes a yes-no display of engine operation being in an automatic reduced speed mode.

67. Apparatus in accordance with claim 60 wherein the switch section includes a yes-no display of whether or not a water temperature switch or water temperature sensor is indicating the engine is overheating.

68. Apparatus in accordance with claim 60 wherein the switch section includes a yes-no display whether or not oil pressure is being sensed by an oil pressure switch.

69. Apparatus in accordance with claim 60 wherein the switch section includes a yes-no display of whether a shift interrupter switch is in an interrupted condition.

70. Apparatus in accordance with claim 60 wherein the switch section includes a yes-no display of whether or not the ECU indicates detection of water in an engine-mounted fuel canister.

71. Apparatus in accordance with claim 60 wherein the voltage section includes a display of alternator voltage output.

72. Apparatus in accordance with claim 60 wherein the results section includes a display of engine speed in RPM.

73. Apparatus in accordance with claim 60 wherein the results section includes a display of ignition timing.

74. Apparatus in accordance with claim 60 wherein the results section includes a display of spark duration.

75. Apparatus in accordance with claim 60 wherein the results section includes a display of fuel timing.

76. Apparatus in accordance with claim 60 wherein the results section includes a display of fuel pulse width.

77. Apparatus in accordance with claim 60 wherein the results section includes a display of barometric pressure.

78. A diagnostic method of servicing an engine including an ECU, diagnostic the method utilizing a processor including a memory and a display screen coupled to the processor, said method comprising the steps of:

coupling the processor to the engine ECU;

displaying on said display screen a plurality of screen displays in a user selected language, at least one of said screen displays facilitating;

provision of a service report, at least one screen display facilitating provision of a first item of engine component information, and at least one screen display facilitating testing of an ignition circuit, said processor energizing said ignition circuit upon receipt of a user predetermined operator command.

79. The method of claim 78 wherein said first item of engine component information is one of information relating to a fuel injector and information relating to an ECU.

* * * * *

UNITED STATES PATENT AND TRADEMARK OFFICE
CERTIFICATE OF CORRECTION

PATENT NO.   : 6,615,160 B1
DATED        : September 2, 2003
INVENTOR(S)  : Quinnett et al.

It is certified that error appears in the above-identified patent and that said Letters Patent is hereby corrected as shown below:

Column 3,
Lines 38, 60 and 62, delete "25" and substitute therefor -- 27 --.

Signed and Sealed this

Twenty-first Day of October, 2003

JAMES E. ROGAN
*Director of the United States Patent and Trademark Office*